US006692886B2

(12) United States Patent
Yamada

(10) Patent No.: US 6,692,886 B2
(45) Date of Patent: Feb. 17, 2004

(54) METHOD FOR MANUFACTURING A LITHOGRAPHIC PRINTING PLATE

(75) Inventor: Jun Yamada, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 0 days.

(21) Appl. No.: 10/092,719

(22) Filed: Mar. 8, 2002

(65) Prior Publication Data

US 2002/0177064 A1 Nov. 28, 2002

(30) Foreign Application Priority Data

Mar. 12, 2001 (JP) ....................................... 2001-067928

(51) Int. Cl.$^{7}$ .......................... G03C 8/28; G03C 11/22; G03F 7/16; G03F 7/07

(52) U.S. Cl. ........................ 430/231; 430/204; 430/935

(58) Field of Search ................................ 430/231, 204, 430/935

(56) References Cited

U.S. PATENT DOCUMENTS

| | | | | |
|---|---|---|---|---|
| 5,427,889 A | | 6/1995 | Saikawa et al. | 430/204 |
| 5,633,115 A | | 5/1997 | Jaeger et al. | |
| 5,645,972 A | | 7/1997 | Jonkheere | 430/204 |
| 6,146,808 A | * | 11/2000 | Joncheere | 430/204 |
| 6,187,503 B1 | * | 2/2001 | Ohashi | 430/204 |

FOREIGN PATENT DOCUMENTS

| | | |
|---|---|---|
| EP | 0567178 | 10/1992 |
| JP | A-6-301212 | 10/1994 |
| JP | A-7-56343 | 3/1995 |
| JP | A-7-64291 | 3/1995 |
| JP | A-7-110578 | 4/1995 |

* cited by examiner

*Primary Examiner*—Richard L. Schilling
(74) *Attorney, Agent, or Firm*—Paul E. White, Jr.; Manelli Denison & Selter PLLC

(57) ABSTRACT

An object of the present invention is to provide a method for manufacturing an aluminum printing plate which is superior in fine line reproduction and has no occurrence of spot-like defect in the silver image part. According to the present invention, a method for manufacturing a lithographic printing plate is provided, wherein an aluminum plate subjected to at least graining treatment and anodizing treatment is rinsed with water, then coated with a liquid containing physical development nuclei, and subsequently coated with a silver halide emulsion layer.

7 Claims, 1 Drawing Sheet

METHOD FOR MANUFACTURING A LITHOGRAPHIC PRINTING PLATE

BACKGROUND OF THE INVENTION

The present invention relates to a method for manufacturing a lithographic printing plate coated with at least physical development nuclei and a silver halide emulsion layer on an aluminum plate.

A lithographic printing plate which can utilize a transferred silver image obtained by the silver complex diffusion transfer reversal process (DTR process) as ink receptive portions has been known. A typical lithographic printing plate of this type is the one having an undercoat layer, a silver halide emulsion layer and a physical development nuclei layer on a support (such as a paper base coated with polyethylene resin and a poly(ethylene terephthalate) film base) in this order, and described, for example, in U.S. Pat. No. 3,721,559, No. 3,490,905, No. 3,385,701, No. 3,814,603, No. 3,454,398, No. 3,764,323, No. 3,099,209, No. 5,281,509, No. 5,641,605, JP-B-44-27242, JP-B-48-30562, JP-A-53-9603, JP-A-53-21602, JP-A-54-103104 and JP-A-56-9750.

The above-described lithographic printing plate has physical development nuclei on the surface of silver halide emulsion layer using gelatin as a binder, and exposed silver halide causes a chemical development by the DTR development to become black silver forming a hydrophilic non-image part which is mainly composed of gelatin. In contrast, unexposed silver halide is converted to silver salt complex by a silver salt complexing agent in a developer and diffuses to a physical development nuclei layer in the surface, where metal silver deposits on the physical development nuclei by a physical development to form an ink accepting silver image part.

On the other hand, a lithographic printing plate to which the present invention is directed (hereinafter referred to an aluminum printing plate) is the one which has physical development nuclei on a grained and anodized aluminum support, and further a silver halide emulsion layer thereon. Such aluminum printing plate is described, for example, in U.S. Pat. No. 5,427,889, No. 5,645,972, No. 5,853,950, No. 5,902,719, JP-A-57-118244, JP-A-57-158844, JP-A-63-260491, JP-A-3-116151, JP-A-5-216236 and JP-A-6-81194. This lithographic printing plate is subjected to the DTR development, then the silver halide emulsion layer is washed off with water to obtain a printing plate.

In more detail, metal silver deposits on the physical development nuclei by the DTR development to form a silver image part, which is exposed on an aluminum support by removing the silver halide emulsion layer after washing with water. At the same time, the anodized aluminum surface itself is exposed as a non-image part.

To the exposed silver image part and non-image part, a treatment, so called gumming, is applied, where a finishing solution containing a protective colloid such as gum arabic, dextrin, carboxymethyl-cellulose, polystyrene-sulfonic acid is coated for protecting them. This finishing solution is also called as a fixing solution or a finishing solution, containing a compound which makes the silver image part lipophilic (for example, a nitrogen-containing heterocyclic compound having a mercapto group or a thion group).

A typical process for manufacturing an aluminum lithographic printing plate comprises a process to produce an aluminum support by applying surface treatments such as graining and anodizing, a process for coating a liquid containing physical development nuclei on an aluminum support and a process for coating a silver halide emulsion layer. An aluminum lithographic printing plate produced by such manufacturing processes had a problem that a fine line image not wider than about 100 μm does not reproduced on print. This is considered to be caused by a poor adhesion between the aluminum support and the physical development nuclei. Furthermore, the above-described aluminum printing plate had another problem that a spot-like defect tends to occur in the silver image part.

With regard to a method for manufacturing an aluminum lithographic printing plate, a method to give the physical development nuclei to an aluminum plate in the stage of surface treatment for an aluminum plate had also been proposed, and described, for example, in JP-A-6-301212, JP-A-7-56343, JP-A-7-64291 and JP-A-7-110578. However, no method has been put to a practical use until now because of problems such as an insufficient stability and a complicated facilities.

SUMMARY OF THE INVENTION

Accordingly, an object of the present invention is to provide a method for manufacturing an aluminum printing plate which is superior in a fine line reproduction and has no occurrence of the spot-like defect in the silver image.

The above-described object of the present invention was basically attained by a method for manufacturing a lithographic printing plate, wherein an aluminum plate subjected to at least graining treatment and anodizing treatment was rinsed with water, then coated with a liquid containing physical development nuclei in a wet state of the surface of the aluminum plate, and subsequently coated with a silver halide emulsion layer.

DETAILED DESCRIPTION OF THE INVENTION

Figure 1:
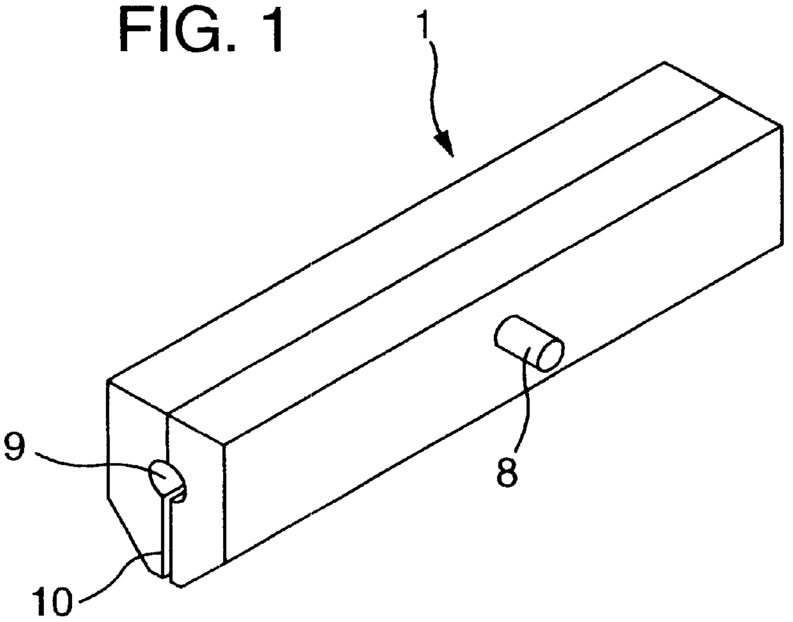
FIG. 1 is an oblique view of the slot coater used in the present invention.

Hereinbelow, the present invention will be described in detail.

A lithographic printing plate of the present invention uses an aluminum plate subjected to surface treatments such as graining treatment and anodizing treatment as a support. As an aluminum plate, a pure aluminum or an aluminum alloy containing a small amount of other metals such as silicon, magnesium, iron, copper, zinc, manganese, chromium and titanium.

Hereinbelow, a surface treatment for an aluminum plate will be described in detail. In the surface treatment process, each treatment of degreasing, graining, desmutting, anodizing and finishing is generally carried out. These treatments are typically carried out continuously using a coil of aluminum. After each treatment, water rinsing is usually done, and finally followed by drying to obtain a support.

Next, the surface treatment processes will be described in order. Degreasing treatment removes an oxide film and the like which are formed by a contact with an oil or air in rolling of the aluminum plate. By degreasing, a clean surface of aluminum plate is exposed in the surface so as to be uniformly treated in the subsequent processes. Degreasing treatment includes a solvent degreasing with, for example, trichloroethylene and perchloroethylene, an alkali degreasing with sodium hydroxide, sodium carbonate, sodium metasilicate, trisodium phosphate, tetrasodium pyrophosphate and soap or mixture thereof, and an emulsion degreasing with a combination of surfactant, kerosene, triethanolamine and sodium hydroxide. In addition, in order to remove stains which can not be removed by the above-described chemical degreasing treatment, an electrolytic degreasing, also called as a finishing degreasing, is sometimes applied.

Graining treatment gives unevenness to the surface of aluminum plate. Providing unevenness to the surface of aluminum plate contributes to an improvement in adhesions of coated layers such as a silver halide emulsion layer by an anchor effect. In an offset printing plate, since the graining gives effects on the basic performances of printing such as press life, water retention and print quality, a variety of methods are in practical use at present stage. For example, a mechanical graining method such as brush graining, ball graining and hydro-honing, a chemical graining method by a chemical etching using hydrochloric acid or nitric acid, an electrolytic graining method by an electrochemical etching using hydrochloric acid or nitric acid, and a graining treatment method by a combination thereof are known.

In an electrolytic graining method, an electrolytic solution mainly comprising hydrochloric acid or nitric acid is used, which is electrolyzed by running direct current or alternating current (single phase or 3 phases). By this treatment, pits are formed on the surface of aluminum. Size, depth and distribution state of the pit can be adjusted by a current density in the electrolysis, concentration, composition and temperature of the electrolytic solution, etc. A shape of the surface of aluminum plate is evaluated by measuring a center line average height using a surface roughness tester after completion of the anodizing treatment. A center line average height (Ra value) of the surface of aluminum plate is preferably in the range of 0.4 to 0.8 $\mu$m.

Power to be supplied to the aluminum plate is suitably set depending on a composition, temperature and a distance between electrodes, etc. In order to obtain the grained surface suitable for a printing plate, the electrolysis is generally performed in the ranges of 1 to 60 V in voltage, 5 to 60 A/dm$^2$ in current density in the treated surface, and 50 to 4,000 coulomb in power. Further, the preferable ranges of temperature of the electrolytic solution is 0 to 60° C. and distance between an electrode and an aluminum plate is 1 to 10 cm.

As an alternating current used in the electrolytic graining, a commercial alternating current of single phase or 3 phases or a sinosoidal wave within the range of 10 to 100 Hz including them, an electric current having a wave form in which a part of an alternating current is cut off by a thyrister, etc., asymmetrical and symmetrical sinosoidal waves and non-sinosoidal waves with an uneven ratio of positive and negative polarities of currents, and symmetric non-sinosoidal wave can be used.

A concentration of acid in the electrolyte solution is 0.1 to 10% by weight, and preferably a concentration of aluminum ion in the electrolyte solution is maintained in the range of 0 to 10 g/liter. In the electrolytic graining treatment, since aluminum dissolves with an acid consumed as the electrolysis proceeds, preferably the electrolyte solution is controlled by replenishing an acid whereas discharging a part of the electrolyte solution.

Then, desmutting treatment is carried out. By the desmutting treatment, smuts are dissolved and a surface with pits appears. In the desmutting treatment, though alkaline agents such as sodium hydroxide, acids such as phosphoric acid, sulfuric acid, nitric acid and perchloric acid, or a mixture thereof can be used, they are used with an adjustment of their capabilities to remove the smut depending on a kind, concentration or temperature of the treatment solution, because each of them has a different smut removing capability. Too strong desmutting treatment not only dissolves the uneven grained surface formed in the graining process to flatten it, but also dissolves all of the above-described metal ions added in the graining solution. Contrary, in the case of too weak desmutting treatment, the smut remains resulting in a black colored surface of support. An amount of smut, etc. to be dissolved from an aluminum plate is suitably 0.05 to 1 g/m$^2$, though it depends on the conditions of the above-described treatment with the electrolyte solution.

An aluminum plate treated for graining and desmutting is then subjected to an anodizing treatment. Aluminum is generally an active metal and an oxide film of around 1 to several nm is naturally formed in air, but its resistance to alkali is not sufficiently high enough if aluminum is used as it is. Therefore, the resistance to alkali is improved by forming an anodic oxide film. In a support for offset lithographic printing plate, in order to attain improvements in water retention of the surface and adhesion of the photosensitive layer such as a silver halide emulsion layer, a porous anodic oxide film is formed as the oxide film. The resistance to alkali becomes higher with a larger thickness of the anodic oxide film, but not only power cost but also stain on print increases as the thickness becomes larger. Therefore, the thickness of anodic oxide film is preferably in the range of 0.8 to 3 g/m$^2$ in a weight base.

As an electrolyte solution used for the anodizing treatment, an acid in which an anodic oxide film formed has a low solubility is preferably used, and sulfuric acid, oxalic acid, chromic acid, phosphoric acid and a mixture thereof can be used. From the view point of productivity, sulfuric acid is preferably used. A size of micropore on the anodic oxide film formed in the anodizing treatment is typically 0.01 to 0.1 $\mu$m, though it varies depending on a kind of the above-described acid.

Since the anodic oxide film is formed only in an anode, a direct current is usually used as an electric current. With respect to the conditions of anodizing treatment, in the case of sulfuric acid, the treatment is carried out in the ranges of 1 to 40% by weight for concentration of the solution, 0.1 to 10 A/dm$^2$ for current density and 5 to 30 V for voltage, and an electric current is supplied by a direct method or an indirect method. A thickness of anodic oxide film is controlled by current density and time. Temperature influences a hardness of anodic oxide film. Since lower temperature gives higher hardness but less flexibility, the anodizing treatment is usually carried out at the temperature around ordinal temperature.

The present invention is performed by anodizing treatment, then rinsing with water, and coating of a liquid containing physical development nuclei (hereinafter, referred to physical development nuclei containing liquid) in a wet state of the surface of aluminum plate. In the present invention, the above-described surface treatment, rinsing with water and coating of a physical development nuclei containing liquid are continuously carried out on line. A water content of the surface of aluminum plate in the coating of a physical development nuclei containing liquid is preferably not lower than 1 g/m$^2$, more preferably not lower than 3 g/m$^2$ for the lower limit, and preferably not higher than 28 g/m$^2$, more preferably not higher than 25 g/m$^2$; and further more preferably not higher than 20 g/m$^2$ for the upper limit.

The conventional process was performed by anodizing treatment, then rinsing with water, and coating of a physical development nuclei containing liquid after completely drying of the surface of aluminum plate, or coating a physical development nuclei containing liquid in a different line from the surface treatment of an aluminum plate. It was found that the present invention could improve the adhesion between an aluminum plate and physical development nuclei as well as reproducibility for a fine line not larger than about 100 μm, and also prevent the spot-like defect (a phenomenon of spot-like loss of image) in an image part by coating a physical development nuclei containing liquid in a wet state of the surface of aluminum plate.

When water of the surface of aluminum plate is completely evaporated, residual substances which could not be washed off in the preceding process coagulate in a spot-like form. These substances cause spot-like defects in the coating when the physical development nuclei containing liquid is coated, resulting in an occurrence of the spot-like defects in the silver image.

Adjustment of a water content of the surface of aluminum plate can be performed by selecting and adjusting a material and nip pressure of the squeezing roller used after rinsing with water, or air blowing. In addition, the water content of the surface of aluminum plate can be continuously controlled on line using a commercially available infrared moisture meter.

In the present invention, a concentration of the physical development nuclei in the physical F development nuclei containing liquid is preferably in the range of 0.001 to 1% by weight, more preferably in the range of 0.001 to 0.1% by weight.

As the physical development nuclei, a negatively chargeable physical development nuclei is preferable. It includes, for example, a metal sulfide obtained by reacting a water-soluble salt of silver, palladium, zinc or the like with sodium thiosulfate or sulfides such as sodium sulfide.

In the surface treatment of aluminum plate, effects of the electric field applied in the electrolytic treatment appear in the preceding and subsequent treatment processes. Particularly in the anodizing treatment conducted by direct current, an effect of cathode in the aluminum plate before the treatment, and an effect of anode in the aluminum plate after the treatment is observed as a leakage potential. Such leakage potential is considered to give some effect on an adhesion of chargeable substances contained in the treatment solution in the preceding and subsequent treatments. Therefore, in the present invention, an adhesion of the physical development nuclei is improved by coating a liquid containing negatively chargeable physical development nuclei continuously after the anodizing treatment and the rinsing with water. The polarity of charged physical development nuclei can be easily distinguished by using a conductive electrode provided in the solution and checking which of cathode or anode the deposition occurs at.

The physical development nuclei containing liquid can further contain a surfactant. As the surfactant, in particular, sulfur containing anionic surfactant is preferable. Thus, an anionic surfactant containing sulfate or sulfonate group is preferable, and such surfactant includes, for example, sodium dodecylbenzenesulfonate, sodium polyoxyethylene-nonylphenylethersulfate, sodium laurylethersulfate, sodium laurylsulfate, disodium polyoxyethylene-laurylsulfosuccinate, sodium dioctylsulfosuccinate and sodium lauroylmethyltaurate.

Addition of the above-described sulfur containing anionic surfactant into the physical development nuclei containing liquid improves an adhesive efficiency of the physical development nuclei due to an increased charge in the liquid, and enables to adhere a sufficient amount of physical development nuclei in a short time. Therefore, it enables to lower the concentration of physical development nuclei in a physical development nuclei containing liquid, leading to a cost down. In addition, as described later, according to the preferable embodiment of the present invention, the physical development nuclei containing liquid is washed with water after coating. Therefore, lowering the concentration of physical development nuclei means reduction of inactive components and excess components to be removed by the rinsing with water, which is preferable from the view point of the environmental preservation.

The physical development nuclei containing liquid can further contain an organic acid, an alkali metal salt of organic acid and alkali metal salt of inorganic acid such as silicic acid, stannic acid, tungstic acid and phosphoric acid. Furthermore, a nonionic surfactant and a hydrophilic polymer (for example, a copolymer of acrylamid and vinylimidazol, a polymer of U.S. Pat. No. 5,695,908) can be added. These additives have an effect to improve dispersion stability of the physical development nuclei and reduce an unevenness in the coating. A pH of the physical development nuclei containing liquid is preferably in the range of pH 3 to 11 in which the surface of aluminum is not dissolved, more preferably in an acidic side of pH 3 to 7. Temperature of the liquid when coated is preferably around ordinary temperature because an anodic oxide film is degenerated at higher temperature.

In the present invention, the physical development nuclei containing liquid is preferably further rinsed with water after coated. By rinsing with water, inactive components and excess components in the physical development nuclei containing liquid are washed away without remaining on the surface, resulting in enabling to prevent an occurrence of a spot-like defect in the coating of silver halide emulsion layer.

As a coating method for the physical development nuclei containing liquid, any known coating method can be used. Particularly preferable coating method is the method using a slot coater. This slot coater has a manifold and a slot. The slot coater is also called as a slot die or an extrusion die. This has been described, for example, in JP-A-6-47332, JP-A-7-256187, JP-A-10-290946.

Figure 2:
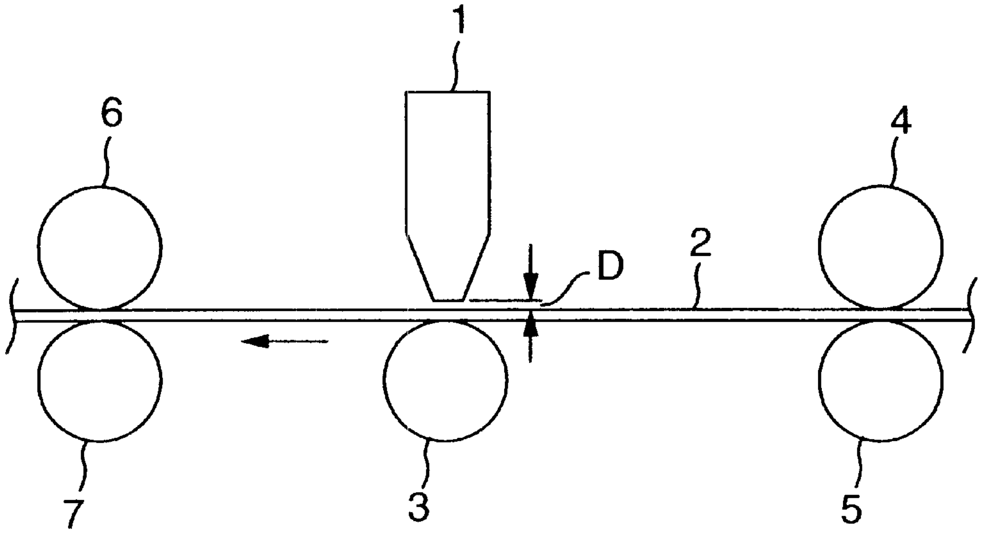
FIG. 2 is a schematic side view of the coating process in the present invention.

FIG. 1 and FIG. 2 show an oblique view of the slot coater and a schematic side view of the coating process, respectively. The slot coater 1 has the manifold 9 and the slot 10 in its inside. The supply port 8 for the liquid communicates to the manifold 9.

The liquid flew in from the liquid supply port 8 is supplied to the slot 10 after once filled in the lateral direction in the manifold 9. Thus, an amount of the liquid flowing out from the slot 10 can be made uniform in the lateral direction. The liquid supply port 8 is usually provided in one position at the center in the lateral direction of the slot die 1, but may be provided at multiple positions in the lateral direction of the slot coater. A cross-sectional shape of the manifold 9 is circular in FIG. 1, but may be an optional shape not limited to this. For example, it may be semicircular, elliptic or rectangular. Further, a cross-sectional area of the manifold 9 may be constant over the whole width of the slot coater, or may be gradually decreased towards the ends in both directions centering at the supply port 8 (when provided roughly at the center in the lateral direction). A gap of the slot 10 is suitably about 0.05 to 1 mm.

Both ends in the lateral direction of the manifold 9 and the slot 10 of the slot coater 1 are blocked by inserting spacers or the like for the liquid not to flow out therefrom, though not shown in FIG. 1. In this case, the spacers or the like should be inserted to block so that an effective length in the lateral direction of the slot becomes the same to or rather longer than the length in the lateral direction of the aluminum plate to be coated.

FIG. 2 shows a schematic side view of a process to coat the physical development nuclei containing liquid on the surface of aluminum plate. The aluminum plate 2, after the above-described surface treatment is applied, comes into the coating process. The aluminum plate 2 is transported to the direction shown by the arrow by means of the conveyance rollers 4, 5, 6 and 7, and coated with the physical development nuclei containing liquid using the slot coater 1. The conveyance rollers 4 and 5 play also as squeeze rollers for rinsing water adhered to the aluminum plate in the rinsing with water in the preceding process. After the physical development nuclei containing liquid is coated, the plate enters into the rinsing process which is not shown, where the surface of aluminum plate is rinsed with water. A time after the physical development nuclei containing liquid is coated until reaches the water rinsing process is preferably not less than 2 seconds. Suitably the upper limit is not longer than 30 seconds from the view point of production efficiency. Rinsing with water is preferably performed before the physical development nuclei containing liquid is completely dried from the view point of washing efficiency.

The back up roller 3 is arranged at the position facing to the slot coater 1. The back up roller 3 has a role to maintain the gap between the aluminum plate 2 and the slot coater 1 uniformly over the whole width. The gap between the aluminum plate 2 and the slot coater 1 is suitably about 0.1 to 1 mm.

A coating amount of the physical development nuclei containing liquid is preferably 5 to 100 ml/m$^2$, more preferably in the range of 20 to 80 ml/m$^2$.

In the present invention, the aluminum plate adhered with the physical development nuclei containing liquid is coated with a silver halide emulsion layer. In this process, between the above-described aluminum plate and the silver halide emulsion layer, an intermediate layer may optionally exist. When an intermediate layer is exist, the intermediate layer and the silver halide emulsion layer are preferably coated simultaneously in lamination using a slide bead coater or a curtain coater. In addition, a protection layer may further be provided on the silver halide emulsion layer.

The silver halide emulsion layer is mainly composed of gelatin and silver halide emulsion. The silver halide emulsion is selected from silver chloride, silver bromide, silver iodide, silver chloride bromide, silver chloride iodide bromide, silver iodide bromide, and the like which are generally used, and preferably a silver halide emulsion mainly comprising silver chloride (containing silver chloride not less than 50% by mole) is used. Further, a type of the silver halide emulsion may be any of a negative working type and a positive working type. These silver halide emulsions are preferably chemically sensitized with gold compounds, sulfur compounds or by a combined use thereof. The silver halide emulsions can also be spectrally sensitized using a sensitizing dye.

As a hydrophilic colloid for the silver halide emulsion layer, gelatin is mainly used. As the gelatin, various types of gelatins such as acid-treated gelatin and alkali-treated gelatin can be used. Also, modified gelatins from them (for example, phthalated gelatin and amidated gelatin) can be used. Moreover, the silver halide emulsion layer may further contain a hydrophilic polymer such as polyvinylpyrrolidone, various types of starches, albumin, polyvinylalcohol, gum Arabic and hydroxyethylcellulose. Preferably the silver halide emulsion layer substantially does not contain a hardening agent to make easy to remove the silver halide emulsion layer after the development.

The silver halide emulsion layer may contain at need dyes and pigments for preventing a halation; various types of surfactants such as anionic, cationic, betaine and nonionic; thickeners such as carboxymethyl-cellulose; anti-foaming agents; chelating agents such as ethylenediamine-tetraacetate; and main ingredient for the developer such as hydroquinone, polyhydroxybenzenes, 3-pyrazolidinones.

The intermediate layer provided at need in the present invention can contain low molecular weight of gelatin having a weight average molecular weight of not higher than 30,000, a non-protein hydrophilic film-forming polymer (for example, polyvinylalcohol, polyvinylpyrolidone, polyethyleneoxide, hydroxymethyl-cellulose, carboxymethyl-cellulose) described in JP-A-3-116151, or hydrophobic polymer beads (for example, alkylalkylate, alkylmethacrylate, styrene, butadiene, or copolymers thereof) described in JP-A-4-282295.

The protection layer provided at need can contain a water-soluble polymer such as pullulan, polyvinylalcohol, polyvinylpyrolidone, polyethyleneoxide, hydroxymethyl-cellulose and carboxymethyl-cellulose.

The intermediate layer and the protection layer can contain dyes and pigments for preventing a halation and various types of surfactants.

The plate making process for the lithographic printing plate of the present invention usually comprises development, water rinsing and finishing treatment. A range of pH of the developer is usually set in the range of pH 10 to 14 considering controlling dissolution of an anodic oxide film on the aluminum plate and a development activity. Preferably the range is pH 12.7 to 13.7. The temperature of developer is preferably 15 to 30° C., and the development time is preferably about 5 to 30 seconds.

The developer preferably contains at least main ingredient for the developer, alkaline substance and solvent for silver halide. The main ingredient for developer includes, for example, polyhydroxybenzenes such as hydroquinone; ascorbic acid and derivatives thereof; and 3-pyrazolidinones such as 1-phenyl-3-pyrazolidinone and derivatives thereof. As an alkaline substance, for example, potassium hydroxide, sodium hydroxide, lithium hydroxide and trisodium phosphate are used. The developer can further contain a preservative such as sulfites; a thickener such as carboxymethyl-cellulose; an anti-foggant such as potassium bromide; a developer regeneration agent such as polyoxyalkylene compounds; a chelating agent such as ethylenediamine tetraacetate, and a gelatin coagulant such as a copolymer of polystyrenesulfonic acid and maleic anhydride.

The solvent for silver halide used for the developer includes, for example, thiosulfates such as sodium thiosulfate and potassium thiosulfate; sulfites such as sodium sulfite and potassium hydrogensulfite; iodides such as potassium iodide and sodium iodide; 2-mercaptobenzoic acid and derivatives thereof; cyclic imides such as uracil; alkanolamines; diamines; mesoionic compounds; and thioethers.

Among these solvents for silver halide, thiosulfates, alkanolamines, mesoionic compounds and thioethers are preferable. An addition amount of thiosulfates is about 4 to 50 g, preferably about 5 to 40 g per 1 liter of developer.

Alkanolamines includes, for example, 2-(2-aminoethylamino) ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, 2-methylaminoethanol and 2-amino-2-methyl-1-propanol. An addition amount is 1 to 100 g, preferably 10 to 100 g per 1 liter of developer.

The mesoionic compounds include the compounds disclosed in JP-A-4-328559, JP-A-9-160248 and JP-A-9-171257. An addition amount of the mesoionic compounds varies depending on various conditions, but is 0.1 to 10 g, preferably 0.1 to 5 g per 1 liter of developer.

The thioether compounds include the compounds described in U.S. Pat. No. 5,200,294 and JP Application-9-89444. An addition amount of the thioether compounds is 0.01 to 20 g, preferably 0.1 to 10 g per 1 liter of developer.

Among the above-described solvent for silver halide, in particular, a combined use of thiosulfates and alkanolamines is preferable.

Preferably, the developer further contains a compound which makes a silver image part lipophilic (lipophilizing agent). The lipophilizing agent includes the compounds described in Andre Lotto and Edith Wide, "Photographic Silver Halide Diffusion Process", Focal Press, London, New York (1972), p. 105, 106. The agent includes, for example, compounds having a mercapto group or a thion group and quaternary ammonium compounds. In the present invention, a compound having a mercapto group or a thion group is preferably used. More preferably, nitrogen-containing heterocyclic compounds having a mercapto group or a thion group are used, which are described in JP-B-48-29723 and JP-A-58-127928. Specific examples of these compounds will be described below.

These compounds include 2-mercapto-4-phenylimidazol, 2-mercapto-1-benzylimidazol, 2-mercapto-benzimidazol, 1-ethyl-2-mercapto-benzimidazol, 2-mercapto-1-butyl-benzimidazol, 1,3-diethyl-benzimidazoline-2-thion, 1,3-dibenzyl-imidazolidine-2-thion, 2,2'-dimercapto-1,1'-decamethylene-diimidazoline, 2-mercapto-4-phenylthiazol, 2-mercapto-benzothiazol, 2-mercapto-naphthothiazol, 3-ethyl-benzothiazoline-2-thion, 3-dodecyl-benzothiazoline-2-thion, 2-mercapto-4,5-diphenyloxazol, 2-mercaptobenzoxazol, 3-pentyl-benzoxazoline-2-thion, 1-phenyl-3-methylpyrazoline-5-thion, 3-mercapto-4-allyl-5-pentadecyl-1,2,4-triazol, 3-mercapto-5-nonyl-1,2,4-triazol, 3-mercapto-4-acetamid-5-heptyl-1,2,4-triazol, 3-mercapto-4-amino-5-heptadecyl-1,2,4-triazol, 2-mercapto-5-phenyl-1,3,4-thiadiazol, 2-mercapto-5-n-heptyl-oxathiazol, 2-mercapto-5-n-heptyl-oxadiazol, 2-mercapto-5-phenyl-1,3,4-oxadiazol, 2-heptadecyl-5-phenyl-1,3,4-oxadiazol, 5-mercapto-1-phenyl-tetrazol, 2-mercapto-5-nitropyridine, 1-methylquinoline-2(1H)-thion, 3-mercapto-4-methyl-6-phenyl-pyridazine, 2-mercapto-5,6-diphenyl-pyradine, 2-mercapto-4,6-diphenyl-1,3,5-triazine, 2-amino-4-mercapto-6-benzyl-1,3,5-triazine and 1,5-dimercapto-3,7-diphenyl-s-triazolino[1,2-a]-s-triazoline.

After the development, water rinsing is carried out. In the water rinsing, the silver halide emulsion layer and the intermediate layer provided at need or the protection layer are removed, and the aluminum plate is exposed. On the aluminum plate, a silver image part consisting of metal silver has been formed. The water rinsing is performed by a method to use jet-spraying of rinsing solution and a method to use rinsing solution and a scrubbing roller. The rinsing solution preferably contains a proteolytic enzyme and a lipophilizing agent.

The silver image part exposed by the water rinsing and the non-image part consisting of aluminum itself are treated with a finishing solution. The finishing solution preferably contains the protective colloid such as gum arabic, dextrin, sodium alginate, propyleneglycol alginate, hydroxyethyl-starch, carboxymethyl-cellulose, hydroxyethyl-cellulose, polyvinylpyroridone, polystyrene sulfonic acid and polyvinylalcohol. In addition, the finishing solution preferably contains the above-described lipophilizing agent in order to further improve a lipophilic property of the image part. The solution may further contain a proteolytic enzyme.

DESCRIPTION OF PREFERRED EMBODIMENT

A method for manufacturing a lithographic printing plate of the present invention will be described more specifically by examples, but the present invention is not limited by these examples.

EXAMPLE 1

(Surface Treatment of an Aluminum Plate)

A 1050 type of aluminum plate coil with the width of 1,030 mm and the thickness of 0.24 mm was applied with the following surface treatment being transferred at the speed of 25 mm/min. Firstly, the aluminum plate was degreased by dipping in 4% by weight of aqueous sodium hydroxide solution at 60° C. for 10 seconds, then rinsed with water. Subsequently, the aluminum plate was dipped in a electrolytic bath filled with a treatment solution (30° C.) containing 1.5% by weight of hydrochloric acid and 2% by weight of acetic acid, and applied with an alternating current electrolytic graining treatment by supplying single phase alternating current of 50 Hz at 40 A/dm$^2$ for 30 seconds from a power source, followed by rinsing with water. The aluminum plate was then treated for desmutting by dipping in a 10% by weight aqueous phosphoric acid solution at 50° C. for 20 seconds, then rinsed with water. After that, 2 g/m$^2$ of an anodic oxide layer was formed by passing in the solution containing 25% by weight of sulfuric acid at 25° using the indirect method. After rinsing with water, the water on the aluminum plate was squeezed with a nip roller. A water content remaining on the surface of aluminum plate was controlled by adequately combining a nip roller pressure and a hot air blow. At the same time, an aluminum plate from which water was almost completely evaporated was prepared as a comparative example. The water contents remaining on the surface of aluminum plate are shown in Table 1.

Subsequently, the aluminum plate was coated with the physical development nuclei containing liquid shown below continuously on line using the slot coater shown in FIG. 1. An amount of coating was 30 ml/m$^2$. After left for 10 seconds since coated, the aluminum plate was rinsed with water, then dried. A slot gap of the slot coater was 0.1 mm, and a gap between a tip of the slot coater and the aluminum plate was 0.3 mm.

(Physical Development Nuclei Containing Liquid)

A liquid containing 0.01% by weight of palladium sulfide was prepared by mixing palladium chloride and sodium thiosulfate. The pH of liquid was adjusted at 4.

Amounts of the physical development nuclei (palladium sulfide) adhered on the surface of the aluminum support produced as described above are shown in Table 1.

Then, each of the above-described aluminum supports was coated with the following silver halide emulsion layer so that the coated amount became 2 g/m$^2$ in silver (3.14 g/m$^2$ in converted silver nitrate) and 2.5 g/m$^2$ in gelatin to obtain lithographic printing plates.

(Silver Halide Emulsion Layer)

As a silver halide emulsion layer, a silver chloride iodide bromide emulsion (silver chloride 84.6% by mole, silver bromide 15% by mole, silver iodide 0.4% by mole, average particle size 0.2μ) doped with 0.006 mmole per 1 mole of silver of potassium hexachloroillidate (IV) was prepared using an alkali-treated gelatin as a protective colloid by the controlled double jet method. Then, the silver halide emulsion was flocculated, followed by rinsing with water and dehydration. This silver halide emulsion was further applied with sulfur and gold sensitizations, added with a stabilizer, applied with a spectral sensitization by adding 3 mg per 1 g silver of spectral sensitizing dye for a red region, and finally added with a surfactant.

The lithographic printing plates prepared as described above were exposed using an imager equipped with a red LD laser of 633 nm as a light source, then processed on a plate making processor (SLT-85N automatic processor made by Dupont Corp.) to obtain offset printing plates. The above-described plate making processor comprises developing process (22° C.), water rinsing process (wash off the silver halide emulsion layer with a scrubbing roller with shower spray of rinsing solution at 35°), finishing process (21°) and drying process. Compositions of the developer, the rinsing solution and the finishing solution are described below.

| | |
|---|---|
| (Developer) | |
| Sodium hydroxide | 25 g |
| Copolymer of polystyrenesulfonic acid and maleic anhydride | |
| (Average molecular weight 500,000) | 10 g |
| Ethylenediamine tetraacetate | 2 g |
| Anhydrous sodium sulfite | 100 g |
| Monomethylethanolamine | 50 g |
| 2-Mercapto-5-n-heptyl-oxadiazol | 0.5 g |
| Sodium thiosulfate (pentahydrates) | 8 g |
| Hydroquinone | 15 g |
| 1-Phenyl-3-pyrazolidinone | 3 g |
| Aminotri(methylenephosphonic acid) | 10 g |
| Sodium hydroxide | 5 g |
| Deionized water was added to the total volume of 1,000 ml. | |
| pH (25° C.) = 13.1 | |
| (Rinsing solution) | |
| 2-Mercapto-5-n-heptyl-oxaziazol | 0.5 g |
| Monoethanolamine | 13 g |
| Sodium hydrogensulfite | 10 g |
| Potassium primary phosphate | 40 g |
| Proteolytic enzyme | 1 g |
| Water was added to the total volume of 1,000 cc | |
| pH was adjusted at 6.0. | |
| As the proteolytic enzyme, Bioprase AL-15 (Bacterial proteinase, supplied by Nagase & Company, Ltd.) was used. | |
| (Finishing solution) | |
| Phosphoric acid | 0.5 g |
| Monoethanolamine | 5.0 g |
| 2-Mercapto-5-n-heptyl-oxaziazol | 0.5 g |
| Polyglycerol (6-mer) | 50 g |
| Deionized water was added to the total volume of 1,000 ml. | |
| pH was adjusted at 7.2. | |

With the printing plates made as described above, amounts of silver in the silver image parts were measured. Results are shown in Table 1. The amounts of silver in the silver image parts in Table 1 are the values converted to the amounts of silver nitrate.

TABLE 1

| | Water Content (g/m$^2$) | Amount of Adhered Palladium Sulfide (mg/m$^2$) | Amount of Silver in Silver Image Part (g/m$^2$) |
|---|---|---|---|
| Present Invention 1 | 25 | 0.3 | 0.6 |
| Present Invention 2 | 20 | 0.4 | 0.7 |
| Present Invention 3 | 15 | 0.5 | 0.8 |
| Present Invention 4 | 10 | 0.6 | 1.1 |
| Present Invention 5 | 8 | 0.8 | 1.4 |
| Present Invention 6 | 3 | 1.2 | 1.7 |
| Comparative Example | <0.1 | 1.4 | 1.7 |

Next, Printability of each printing plate was evaluated on a press, Heidelberg TOK (trade mark of the offset press made by Heiderberg), using an ink (New Champion Black H, made by Dainippon Ink & Chemicals, Inc.) and a commercially available dampening liquid for PS plate.

The printing plate for comparison had an occurrence of the spot-like losses in the silver image part, and failed to faithfully reproduce fine lines of 100 μm on the print. Contrary to this, the printing plates of the present invention had no occurrence of the spot-like loss in the silver image part, and showed superior reproductions in fine lines.

EXAMPLE 2

By further adding a sulfur-containing anionic surfactant to the physical development nuclei containing liquid used in Example 1, physical development nuclei containing liquids were prepared, in which the concentrations of palladium sulfide and the surfactant were varied as described below.

Physical development nuclei containing liquid A; Concentration of palladium sulfide 0.01% by weight, concentration of sodium polyoxyethylene-nonylphenylether-sulfate 0.01% by weight, amount of coating 30 g/m$^2$.

Physical development nuclei containing liquid B; Concentration of palladium sulfide 0.005% by weight, concentration of sodium laurylether-sulfate 0.005% by weight, amount of coating 15 g/m$^2$.

After the water contents of the surfaces of aluminum plates were adjusted at 15 g/m$^2$ or 3 g/m$^2$, the above-described physical development nuclei containing liquids were coated in the same manner as in Example 1, followed by rinsing with water. Amounts of the physical development nuclei (palladium sulfide) adhered on the surfaces of thus produced aluminum supports were measured. Results are shown in Table 1.

On the aluminum supports obtained as described above, the silver halide emulsion layer was coated in the same manner as in Example 1 to obtain each lithographic printing plate. Printing plates were prepared from these lithographic printing plates by developing in the same manner as in Example 1, then evaluated in the same manner as in Example 1. Amounts of silver in the silver image parts are shown in Table 2.

TABLE 2

| | Water Content on Aluminum Plate Surface ($g/m^2$) | Physical Development nuclei Containing Liquid | Amount of Adhered Palladium Sulfide ($mg/m^2$) | Amount of Silver in Silver Image Part ($g/m^2$) |
|---|---|---|---|---|
| Present Invention 7 | 15 | A | 0.8 | 1.1 |
| Present Invention 8 | 3 | B | 0.8 | 1.1 |
| Present Invention 9 | 3 | C | 0.7 | 1.0 |

An addition of a sulfur-containing anionic surfactant to the physical development nuclei containing liquid accelerates adhesion of the physical development nuclei (palladium sulfide), and increases the adhesion amount of palladium sulfide. In addition, a sufficient amount of palladium sulfide can adhere even if the concentration of physical development nuclei (palladium sulfide) in the physical development nuclei containing liquid is lowered.

As the result of the printing evaluation, it was found that every printing plate had no spot-like loss in the silver image part showing a superior fine line reproduction.

What is claimed is:

1. A method for manufacturing a lithographic printing plate, wherein an aluminum plate subjected to at least graining treatment and anodizing treatment is rinsed with water, then coated with a liquid containing physical development nuclei in a state of a water remaining on the surface of the aluminum plate being 1 to 28 $g/m^2$, and subsequently coated with a silver halide emulsion layer.

2. A method for manufacturing a lithographic printing plate according to claim 1, wherein the liquid containing physical development nuclei further contains sulfur-containing anionic surfactant.

3. A method for manufacturing a lithographic printing plate according to claim 1, wherein the liquid containing physical development nuclei is coated in a state with a water remaining on the surface of aluminum plate of 1 to 25 $g/m^2$.

4. A method for manufacturing a lithographic printing plate according to claim 1, wherein the liquid containing physical development nuclei is coated in a state with a water remaining on the surface of aluminum plate of 1 to 20 $g/m^2$.

5. A method for manufacturing a lithographic printing plate according to claim 1, wherein the liquid containing physical development nuclei is coated, then said coated surface is rinsed with water, the silver halide emulsion layer is coated thereafter.

6. A method for manufacturing a lithographic printing plate according to claim 1, wherein the liquid containing physical development nuclei is coated using a slot coater having a manifold and a slot.

7. A method for manufacturing a lithographic printing plate according to claim 1, wherein the liquid containing physical development nuclei contains 0.001 to 1% by weight of physical development nuclei.

* * * * *